United States Patent
Matsui

(10) Patent No.: US 7,315,158 B1
(45) Date of Patent: Jan. 1, 2008

(54) PULSE WIDTH MODULATION CIRCUIT

(75) Inventor: Satoshi Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 11/494,620

(22) Filed: Jul. 28, 2006

(30) Foreign Application Priority Data

Mar. 27, 2006  (JP) .............................. 2006-086372

(51) Int. Cl.
*G05F 1/40* (2006.01)

(52) U.S. Cl. .................................................. 323/283

(58) Field of Classification Search ................ 323/268, 323/282, 283, 288, 351; 363/21.1, 26, 41
See application file for complete search history.

(56) References Cited

U.S. PATENT DOCUMENTS

| | | | |
|---|---|---|---|
| 6,801,146 B2 * | 10/2004 | Kernahan et al. ........... | 341/122 |
| 6,819,190 B2 * | 11/2004 | Pearce et al. ................. | 331/57 |
| 6,825,644 B2 * | 11/2004 | Kernahan et al. ........... | 323/283 |
| 6,841,983 B2 * | 1/2005 | Thomas ....................... | 323/322 |
| 7,157,889 B2 * | 1/2007 | Kernahan et al. ........... | 323/268 |

FOREIGN PATENT DOCUMENTS

JP    7-183779 A    7/1995

* cited by examiner

*Primary Examiner*—Adolf Berhane
(74) *Attorney, Agent, or Firm*—Arent Fox LLP.

(57) ABSTRACT

A PWM circuit includes a counter, a cycle register, a cycle detector, a pulse width register, a pulse width detector, an additional pulse width register, a voltage generator, a selector, and a voltage controller. The voltage controller controls the selector so as to add a first additional pulse at a first voltage to the end of a pulse width, based on a cycle detection signal outputted by the cycle detector, a pulse width detection signal outputted by the pulse width detector, and a set value indicating the first voltage of the first additional pulse outputted by the additional pulse register, thereby deciding a voltage outputted from the PWM circuit and a period in which the voltage is output.

8 Claims, 15 Drawing Sheets

| output voltage | S1 | S2 | S3 |
|---|---|---|---|
| V0 | 0 | 0 | 0 |
| V1 | 1 | 0 | 0 |
| V2 | 0 | 1 | 0 |
| V3 | 1 | 1 | 0 |
| V4 | 0 | 0 | 1 |

Fig. 2(a)

| LG1 | LG2 | LG3 | S1 | S2 | S3 | output voltage |
|---|---|---|---|---|---|---|
| 1 | 0 | 0 | 0 | 0 | 1 | V4 |
| 0 | 1 | 0 | 0 | 0 | 0 | V0 |
| 0 | 0 | 1 | 0 | 1 | 0 | (VSEL=(V2)) |

Fig. 2(b)

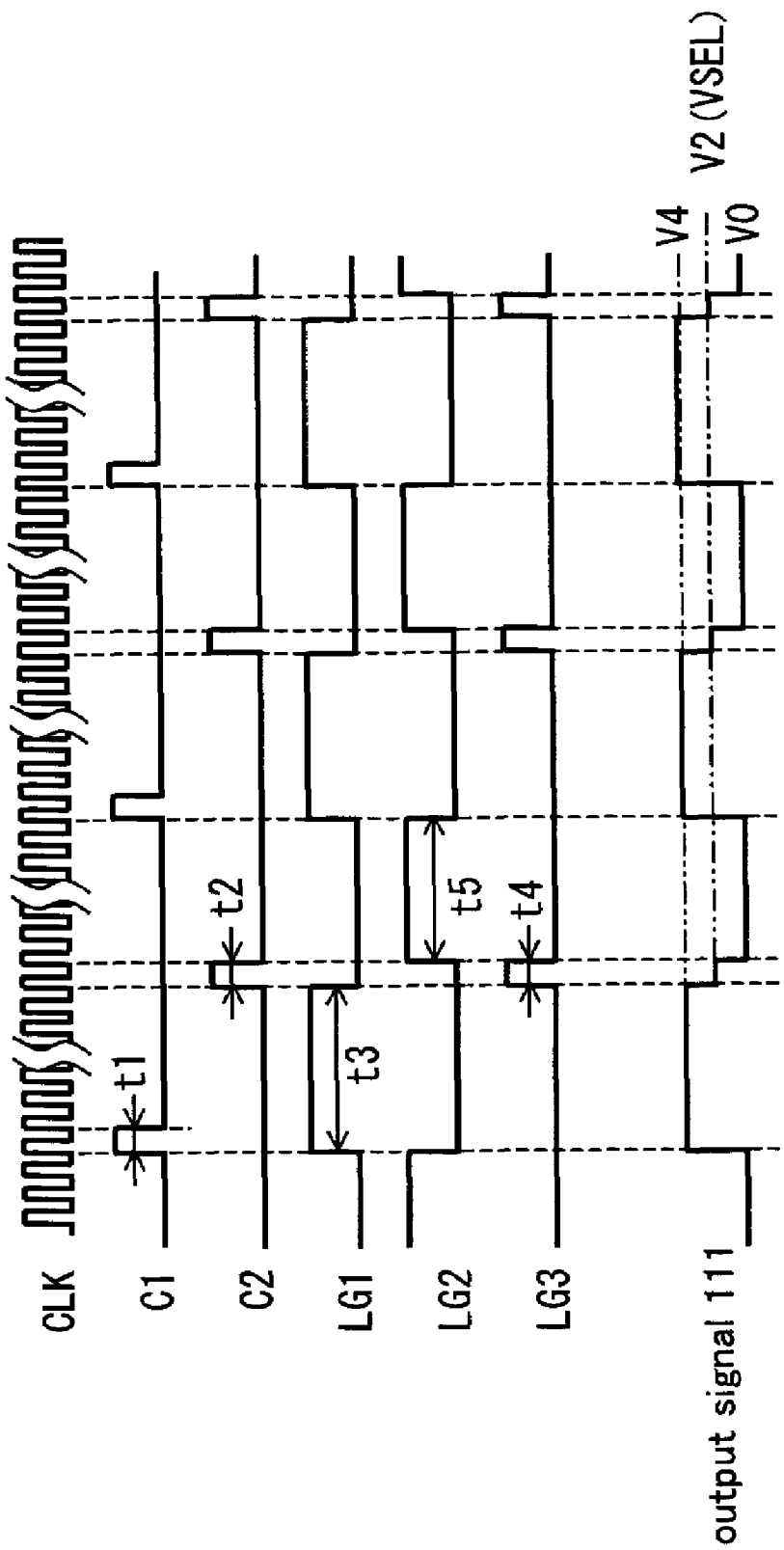

| LG1 | LG2 | LG3 | LG4 | S1 | S2 | S3 | output voltage |
|---|---|---|---|---|---|---|---|
| 1 | 0 | 0 | 0 | 0 | 0 | 1 | V4 |
| 0 | 1 | 0 | 0 | 0 | 0 | 0 | V0 |
| 0 | 0 | 1 | 0 | 1 | 1 | 0 | (VSEL1=(V3)) |
| 0 | 0 | 0 | 1 | 1 | 0 | 0 | (VSEL2=(V1)) |

Fig. 10

PULSE WIDTH MODULATION CIRCUIT

CROSS REFERENCE TO RELATED APPLICATION

This application is based upon and claims the benefit of priority from Japanese Patent Application No. 2006-086372, filed on Mar. 27, 2006, the entire contents of which are incorporated herein by reference.

BACKGROUND OF THE INVENTION

1. Field of the Invention

The present invention relates to a PWM circuit according to a multi-rate method.

2. Description of the Related Art

Conventionally, a PWM circuit that controls electric power supplied to a load by varying a duty ratio of a pulse signal has been in use for controlling speed of a motor, dimming of lighting equipment, and the like. When a high-level period of such a PWM circuit is lengthened, the electric power supplied to the motor and the lighting equipment increases, resulting in an increase in a rotational speed of the motor and brightness of the lighting. On the contrary, when the high-level period thereof is shortened, the electric power supplied to the motor and the lighting equipment decreases, resulting in a decrease in the rotational speed of the motor and brightness of the lighting (see, for example, Japanese Unexamined Patent Application Publication No. Hei 07-183779).

Variation of the high-level period is generally done by changing the number of reference clocks counted in this period, therefore, a length of the high-level period can only be changed in increments/decrements of a reference clock. For example, assuming that the number of the reference clocks to generate one cycle of output of the PWM circuit is 10000 clocks, when the high-level period is increased by one clock, an incremental ratio of the high-level period will be 1/10000. However, the incremental ratio cannot be 1/10000 or less. Heightening the frequency of the reference clocks makes the width of one clock shorter, enabling high-precision variation of the period. But, in order to achieve that, a counter or the like with a high operational speed is needed, creating an operational limit and increasing cost. In view of this problem, there is a PWM circuit according to a multi-rate method in common use which enables precise variation by one reference clock or less.

For example, a conventional PWM circuit according to the multi-rate method controls electric power supplied to a motor or the like with precision of one reference clock or less by, for example, increasing the length of the high-level period by one clock once in several cycles of a pulse signal outputted from the PWM circuit while keeping a cycle of the pulse signal unchanged. For example, assuming that the number of the reference clocks for generating one cycle of the output of the PWM circuit is 10000 clocks, when the length of the high-level period is increased once by one clock in two cycles, an incremental ratio of the high-level period is 1/20000. Likewise, when it is increased once by one clock in four cycles, the incremental ratio of the high-level period can be 1/40000, so that high-precision control is enabled irrespective of the frequency of the reference clocks.

The conventional PWM circuit according to the multi-rate method can perform power control with high precision of one clock or less by increasing the length of the high-level period once in several cycles of the PWM output. However, since the high-level period thereof contains increased cycles and non-increased cycles both, jitter occurs in a signal waveform of the PWM output. With the jitter in the signal waveform of the PWM output, a signal given to the load of a motor or lighting equipment will include a distortion component therein, which problematically affects the operation of the equipment.

A possible solution to remove such distortion is to use a filter or the like, but this also involves a problem of increased circuit scale and cost.

SUMMARY OF THE INVENTION

In view of the aforesaid problems, it is an object of the present invention to enable high-precision control in a PWM circuit without causing any jitter in a signal waveform of a PWM output and to provide a PWM circuit small in circuit scale at a low cost.

In one embodiment of the present invention, a PWM circuit includes a counter, a cycle register, a cycle detector, a pulse width register, a pulse width detector, an additional pulse register, a voltage generator, a selector, and a voltage controller.

The counter counts reference clocks. The cycle detector detects whether or not an output value of the counter has reached a set value indicating a cycle registered in the cycle register. The pulse width detector detects whether or not the output value of the counter has reached a set value indicating a pulse width registered in the pulse width register. The selector selects one voltage from a plurality of voltages generated by the voltage generator. The additional pulse register sets an output voltage (first voltage) of a first additional pulse that is to be added to the pulse width.

The voltage controller controls the selector to decide a voltage outputted from the PWM circuit and a period in which the voltage is output. Specifically, the voltage controller controls the selector so as to add the first additional pulse at the first voltage to an end of the pulse width, according to a cycle detection signal outputted by the cycle detector, a pulse width detection signal outputted by the pulse width detector, and a set value indicating the first voltage of the first additional pulse outputted by the additional pulse register.

In this manner, the PWM circuit according to the present invention can select a plurality of voltages for output. As a result, for example, by setting a voltage outputted in a period of the additional pulse equal to a half of a voltage outputted in a period of the pulse width, it is possible to realize precise load control without causing any jitter in a PWM output waveform.

In a preferable example of the above-described embodiment, with a provision of an additional pulse detector detecting the output value of the counter and a preset period of the first additional pulse, it is possible to vary the additional pulse. For example, it is possible to set not only an additional pulse with a width corresponding to one reference clock but also an additional pulse with a width corresponding to a plurality of reference clocks such as two reference clocks. This realizes slow, smooth variation of the output voltage of the PWM circuit, which can reduce the influence to a load. Alternatively, the additional pulse register is configured to set the set value indicating the first voltage of the first additional pulse and a set value indicating a second voltage of a second additional pulse, which allows the voltage controller to control the selector so as to add the first additional pulse and the second additional pulse in sequence to the pulse width. For example, in a case where the first voltage is set to ⅔ of the output voltage of the pulse width and the second voltage is set to ⅓ thereof, the output voltage of the PWM circuit can be gradually lowered from the output voltage of the pulse width by two steps, which can realize smoother voltage variation. Further, the counter can be constituted of an up counter, a down counter, or the like, and the voltage generator can be constituted of a simple voltage divide resistance circuit. Further, adding a period of the first additional pulse or a second additional pulse to a beginning and/or an end of the pulse width enables smoother control.

For example, setting a voltage outputted in a period of the additional pulse to ½ of a voltage outputted in a period of the pulse width enables high-precision load control without causing any jitter in the PWM output waveform.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 2(a) and FIG. 2(b) are charts to explain logic of a selector 110 and a voltage controller 108 respectively;

FIG. 3 is a chart showing operational waveforms in the first embodiment;

FIG. 10 is a chart to explain logic of a voltage controller 303;

DESCRIPTION OF THE PREFERRED EMBODIMENTS

Embodiments of the present invention will be described by using the drawings.

First Embodiment

Figure 1:
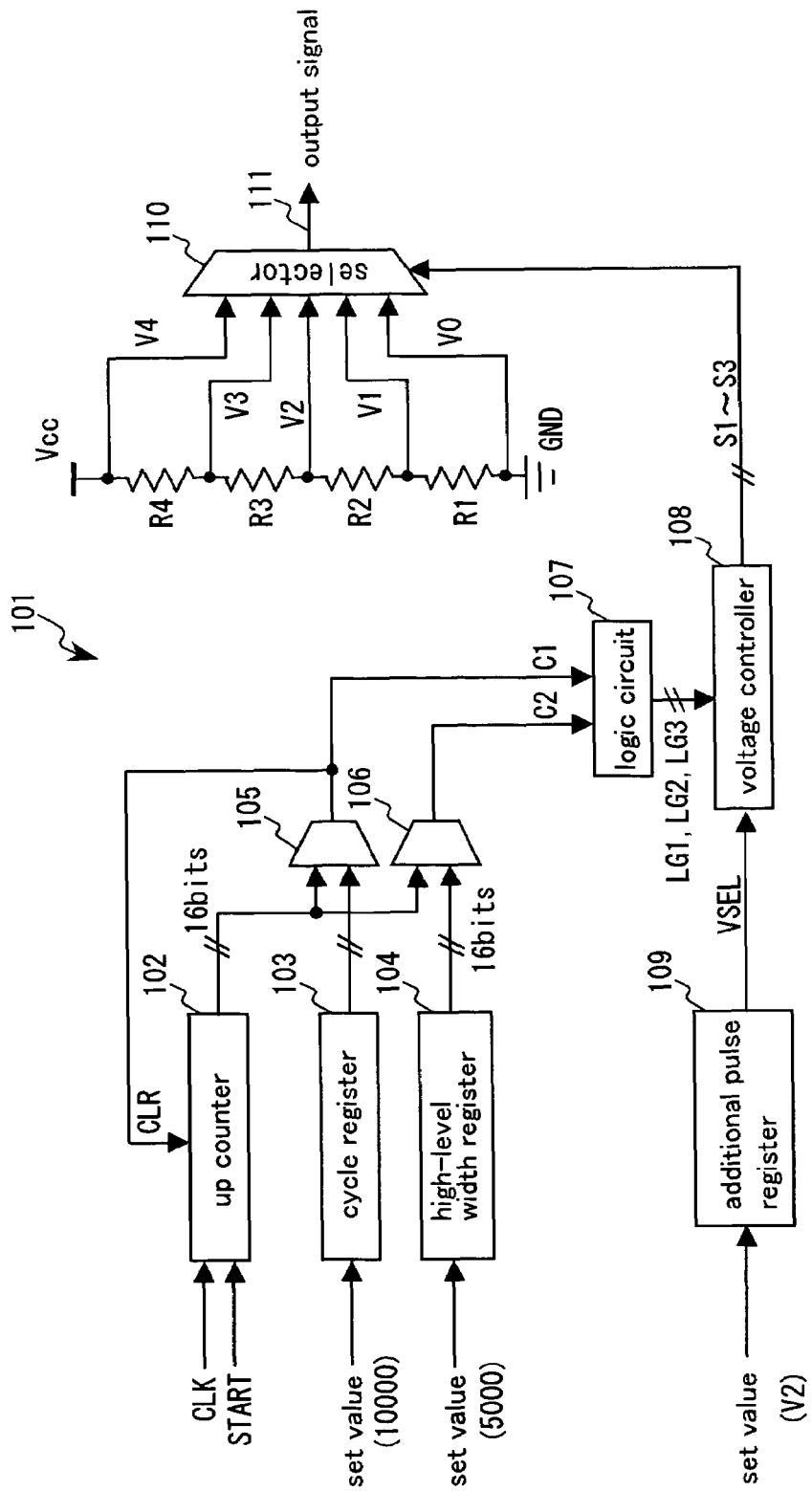
FIG. 1 is a block diagram of a multi-rate PWM circuit 101 according to a first embodiment of the present invention.

FIG. 1 is a block diagram of a PWM circuit by a multi-rate method according to a first embodiment of the present invention. A multi-rate PWM circuit 101 includes an up counter 102, a cycle value register 103, a high-level width register 104, comparators 105 and 106, a logic circuit 107, a voltage controller 108, an additional pulse register 109, a selector 110, and resistances R1, R2, R3, R4 constituting a voltage divide resistance circuit. Reference clocks CLK, a start signal START, and set values are assumed to be supplied from an exterior such as an oscillator and a CPU.

When the start signal START is inputted, the up counter 102 increments in synchronization with every reference clock CLK to output a 16-bit count value. The count value is set to 0 (zero) in an initial state of the up counter 102 and when a clear CLR signal is inputted from the comparator 105, the count value is reset to 0 (zero).

For example, the cycle value register 103 registers therein 10000 as a set value in advance, and it constantly outputs the 16-bit set value (10000) to the comparator 105.

The comparator 105 judges whether or not the 16-bit count value outputted by the up counter 102 has reached the set value (10000) registered in the cycle value register 103. When the count value reaches 10000, the comparator 105 outputs a signal C1 with a width corresponding to one reference clock to the logic circuit 107.

For example, the high-level width register 104 registers therein 5000 as a set value in advance, and it constantly outputs the 16-bit set value (5000) to the comparator 106. The comparator 106 judges whether or not the 16-bit count value outputted by the up counter 102 has reached the set value (5000) registered in the high-level width register 104, and when the count value reaches 5000, the comparator 106 outputs a signal C2 with a width corresponding to one reference clock to the logic circuit 107.

Based on the output of the comparator 105 and the output of the comparator 106, the logic circuit 107 outputs, to the voltage controller 108, signals LG1, LG2, L3 indicating timings and widths of three periods in the output of the multi-rate PWM circuit 101, the three periods being a high-level period, a low-level period, and an additional pulse period which is a transitional period from the high-level period to the low-level period. The logic circuit 107 will be described in detail later.

The additional pulse register 109 is a register setting an output voltage (V2) in the period of the additional pulse, and a set value is outputted as a signal VSEL to the voltage controller 108.

Here, the voltage divide resistance circuit constituting the voltage generator with the resistances R1 to R4, the selector 110, and an output signal 111 of the multi-rate PWM circuit 101 will be described. The resistances R1 to R4 are connected in series between a power supply (Vcc) and earth (GND), and a voltage V0 of GND, a voltage V1 between the resistances R1 and R2, a voltage V2 between the resistances R2 and R3, a voltage V3 between the resistances R3 and R4, and a voltage V4 of Vcc are inputted to the selector 110. The selector 110 selects one of the input voltages V0 to V4 according to selection signals S1, S2, S3 outputted from the voltage controller 108 to output the selected voltage as the output signal 111. Logic of the selector 110 at this time is shown in FIG. 2(a). In FIG. 2(a), when logics of the selection signals S1, S2, S3 from the voltage controller 108 are all "0", the output voltage V0 is selected. When the logics of the selection signals S1, S2, S3 are "1", "0", "0" respectively, the output voltage V1 is selected, and likewise, when the logics of the selection signals S1, S2, S3 are "0", "1", "0" respectively, the output voltage V2 is selected, when they are "1", "1", "0" respectively, the output voltage V3 is selected, and when they are "0", "0", "1", the output voltage V4 is selected.

Next, logic of the voltage controller 108 in FIG. 1 is shown in FIG. 2(b). Based on states of the signals LG1 to LG3 outputted from the logic circuit 107, the states of the selection signals S1 to S3 to be outputted to the selector 110 are decided. Specifically, when logics of the signals LG1, LG2, LG3 are "1", "0", "0" respectively, "0", "0", "1" are outputted as the logics of the selection signals S1, S2, S3 to the selector 110 so that the output voltage V4 is selected. Similarly, when the logics of the signals LG1, LG2, GL3 are "0", "1", "0" respectively, "0", "0", "0" are outputted as the logics of the selection signals S1, S2, S3 to the selector 110 so that the output voltage V0 is selected. In particular, when the logics of the signals LG1, GL2, LG3 are "0", "0", "1" respectively, "0", "1", "0" are outputted as the logics of the selection signals S1, S2, S3 to the selector 110 so that the voltage V2 designated by the signal VSEL outputted by the additional pulse register 109 is selected. The logic circuit 107 may be included in the voltage controller 108.

Next, the operation of the multi-rate PWM circuit 101 in FIG. 1 will be described by using FIG. 3. When the number of counts of the reference clocks CLK inputted to the up counter 102 reaches the set value registered in the cycle value register 103, the comparator 105 outputs to the logic circuit 107 the signal C1 with a width t1 corresponding to one reference clock. Similarly, when the number of counts of the reference clocks CLK reaches the set value registered in the high-level width register 104, the comparator 106 outputs to the logic circuit 107 the signal C2 with a width t2 corresponding to one reference clock.

Figure 4:
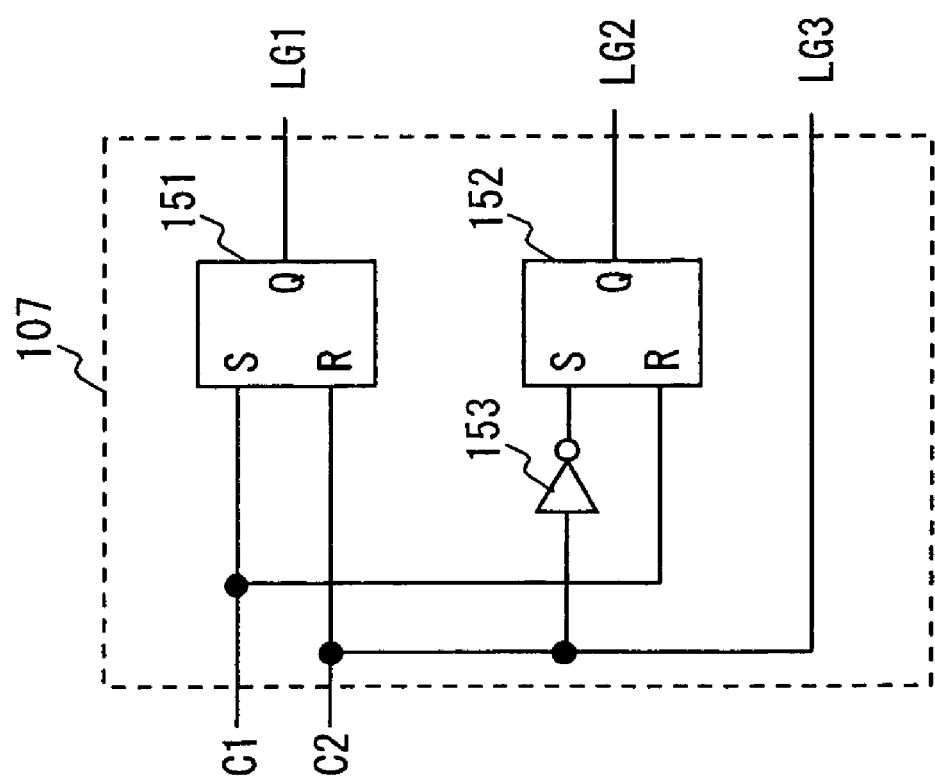
FIG. 4 is a circuit diagram showing an example of a logic circuit 107.

Here, a circuit example of the logic circuit 107 is shown in FIG. 4. The logic circuit 107 includes set reset flipflops (SRFF) 151 and 152 and an inverter 153. Each of the SRFFs 151 and 152, upon receiving a signal at its input S, is set in synchronization with rising of the signal, and logic "1" (high level) is outputted to its output Q. On the other hand, each of the SRFFs 151 and 152, upon receiving a signal at its input R, is reset in synchronization with rising of the signal, and logic "0" (low level) is outputted to the output Q.

In the SRFF 151, the signal C1 is inputted to the input S and the signal C2 is inputted to the input R. In the SRFF 152, the signal C2 is inputted to the input S via the inverter 153 and the signal C1 is inputted to the input R.

Suppose that the output Q of the SRFF 151 is set to "0" and the output Q of the SRFF 152 is set to "1" in an initial state. When the signal C1 is inputted, the SRFF 151 is set, so that logic of the signal LG1 becomes "1". On the other hand, the SRFF 152 is reset, so that logic of the signal LG2 becomes "0". Next, when the signal C2 is inputted, the SRFF 151 is reset, so that logic of the signal LG1 becomes "0". On the other hand, an inverted signal of the signal C2 is inputted to the SRFF 152 since it passes through the inverter 153, so that the SRFF 152 is set in synchronization with a falling edge of the signal C2 and logic of the signal LG1 becomes "1". That is, the SRFF 152 is set at a timing delayed by the width t2 of the signal C2 in FIG. 3. As the signal LG3, the signal C2 is outputted as it is. Instead of using a circuit asynchronously operating as shown in FIG. 4, the logic circuit 107 may be constituted by using a flip-flop circuit or the like operating in synchronization with the reference clocks CLK and may output the signals LG1 to LG3 in synchronization with the reference clocks CLK. In this manner, the signals LG1 to LG3 can be generated based on the reference clocks CLK, the output signal C1 of the comparator 105, and the output signal C2 of the comparator 106.

The voltage controller 108 in FIG. 1 generates the selection signals S1 to S3 based on the signals LG1 to LG3 generated by the logic circuit 107 according to the logic shown in FIG. 2(b), thereby causing the selector 110 to select the output voltage. As a result, the output signal 111 shown in FIG. 3 is obtained.

At this time, a cycle of the output signal 111 of PWM circuit is equal to a cycle of the signal C1, which corresponds to 10000 reference clocks CLK. Further, a pulse width of the high-level period for operating a load is a width t3 and the voltage of the output signal 111 at this time is V4. The additional pulse added after the pulse width is a width t4 and the voltage of the output signal 111 at this time is V2. Similarly, the low-level period between the additional pulse and a next pulse width is a width t5 and the voltage of the output signal 111 at this time is V0. Thereafter, the high-level period, the additional pulse, and the low-level period are similarly repeated.

Figure 5:
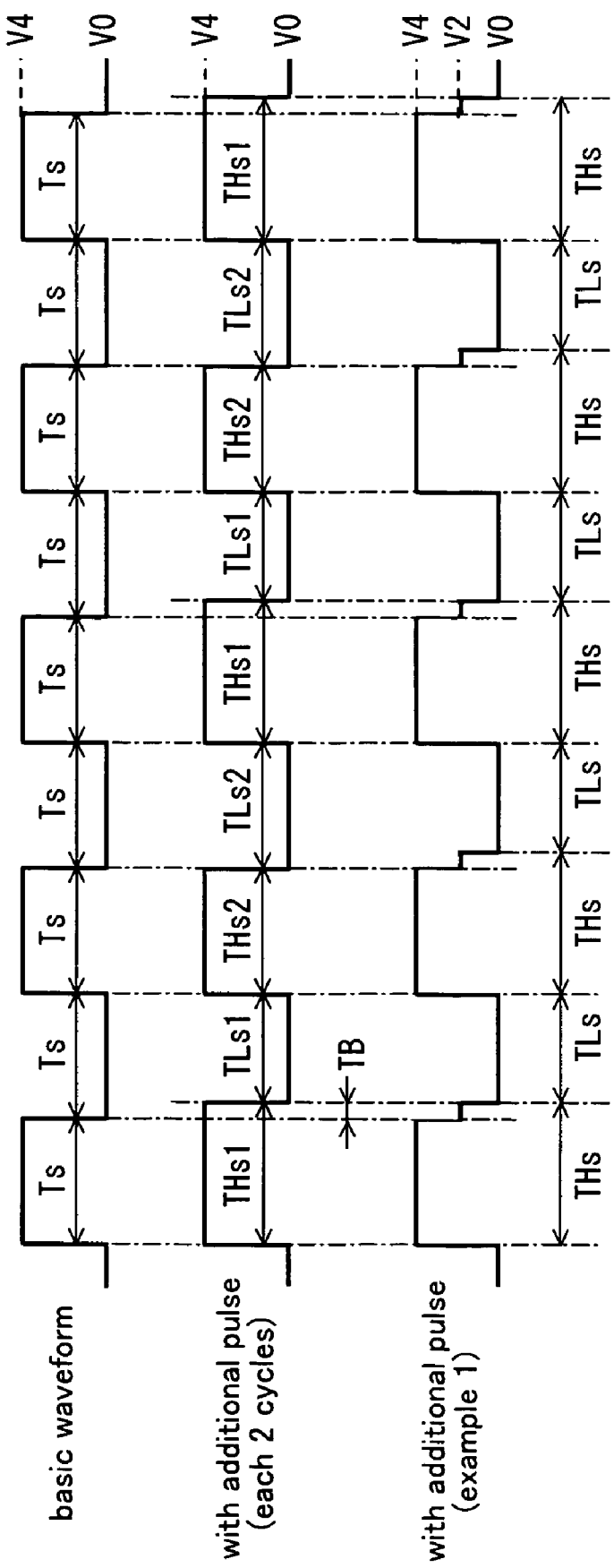
FIG. 5 is a chart to explain waveforms of an output of a multi-rate PWM circuit, which differ in additional pulse.

Next, using FIG. 5, a description will be made on a difference between performing the control with the voltage of the additional pulse being varied as in the first embodiment and performing similar control with the voltage of the additional pulse not being varied. FIG. 5 shows, from the top, a PWM output waveform without any additional pulse, a PWM output waveform with the voltage of the additional pulse not being varied, and a PWM output waveform in this embodiment.

In the basic waveform, the high-level period and the low-level period have the same cycle Ts, and the voltage of the high-level period is V4 and the voltage of the low-level period is V0. Assuming here that the cycle of the basic waveform is equal to a length corresponding to 10000 reference clocks, the high-level period has a length corresponding to 5000 reference clocks. Here, in a case where the high-level period is desired to be increased by a width corresponding to 1/20000 of one cycle, adding a period corresponding to one clock to every high-level period of the basic waveform would result in an increase by a 1/10000 width, and therefore, a period corresponding to one clock is added to the high-level period only once in two cycles. This is the middle waveform in FIG. 5, in which the high-level period in the first cycle is THs1 and the high-level period of the second cycle is THs2, and thus the high-level periods in the both cycles are different from each other by a width TB. Similarly, the low-level period in the first cycle is TLs1 and the low-level period in the second cycle is TLs2, and the low-level periods in the both periods are different from each other by the width TB. As in the basic waveform, the voltage of the high-level period is V4 and the voltage of the low-level period is V0.

On the other hand, in the PWM output waveform of this embodiment, since the additional pulse at the voltage V2 is added to the end of the high-level period in every cycle, so that all the high-level periods have a width THs and all the low-level periods have a width TLs. Moreover, setting the voltage V2 to ½ of the voltage V4 is equivalent to increasing the high-level period in the basic waveform by a 1/20000 width, so that electric power supplied to the load in the high-level period is the same in the both cases.

Thus, since in the output signal 111 of the multi-rate PWM circuit 101, the widths of the high-level period and the low-level period are constant, which causes no jitter to the waveform of the output signal 111. As a result, it is possible to reduce the influence of fluctuation ascribable to the jitter.

Second Embodiment

Figure 6:
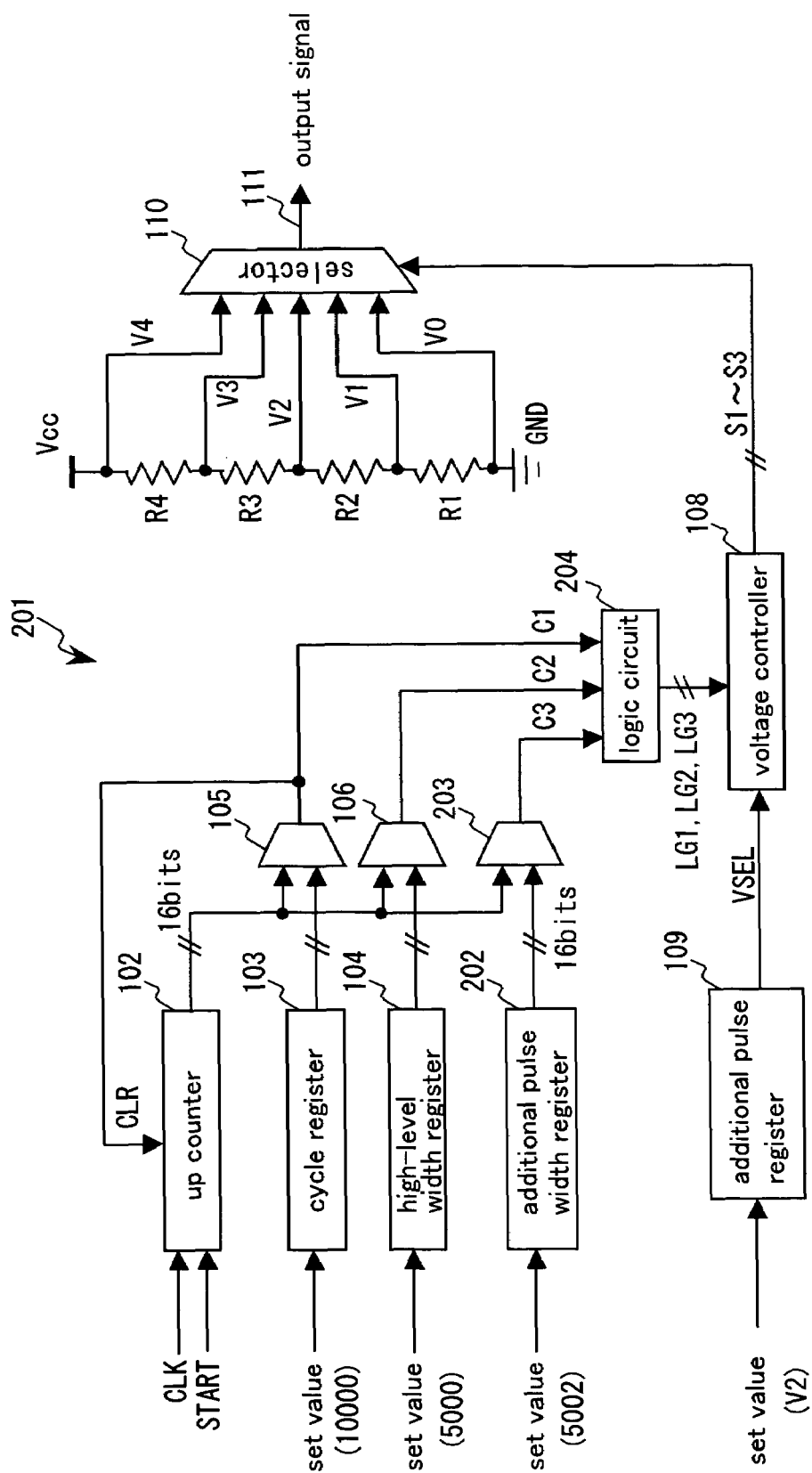
FIG. 6 is a block diagram of a multi-rate PWM circuit 201 according to a second embodiment of the present invention.

Next, a PWM circuit by a multi-rate method according to a second embodiment of the present invention is shown in FIG. 6. The same reference symbols are used to designate the same elements as those of the first embodiment in FIG. 1. A multi-rate PWM circuit 201 is different from the first embodiment in that it additionally includes an additional pulse width register 202 and a comparator 203 and also includes a logic circuit 204 in place of the logic circuit 107.

The additional pulse width register 202, for example, registers therein 5002 as a set value in advance, and it constantly outputs the 16-bit set value (5002) to the comparator 203. The comparator 203 judges whether a 16-bit count value outputted by an up counter 102 has reached the set value (5002) registered in the additional pulse width register 202, and when the count value reaches 5002, the comparator 203 outputs a signal C3 with a width corresponding to one reference clock to the logic circuit 204.

Similarly to the logic circuit 107 of the first embodiment, the logic circuit 204 generates signals LG1, LG2, LG3 to output them to a voltage controller 108, but when generating the signals LG1, LG2, LG3, it refers not only to signals C1, C2 but also to the signal C3 outputted by the comparator 203.

Figure 7:
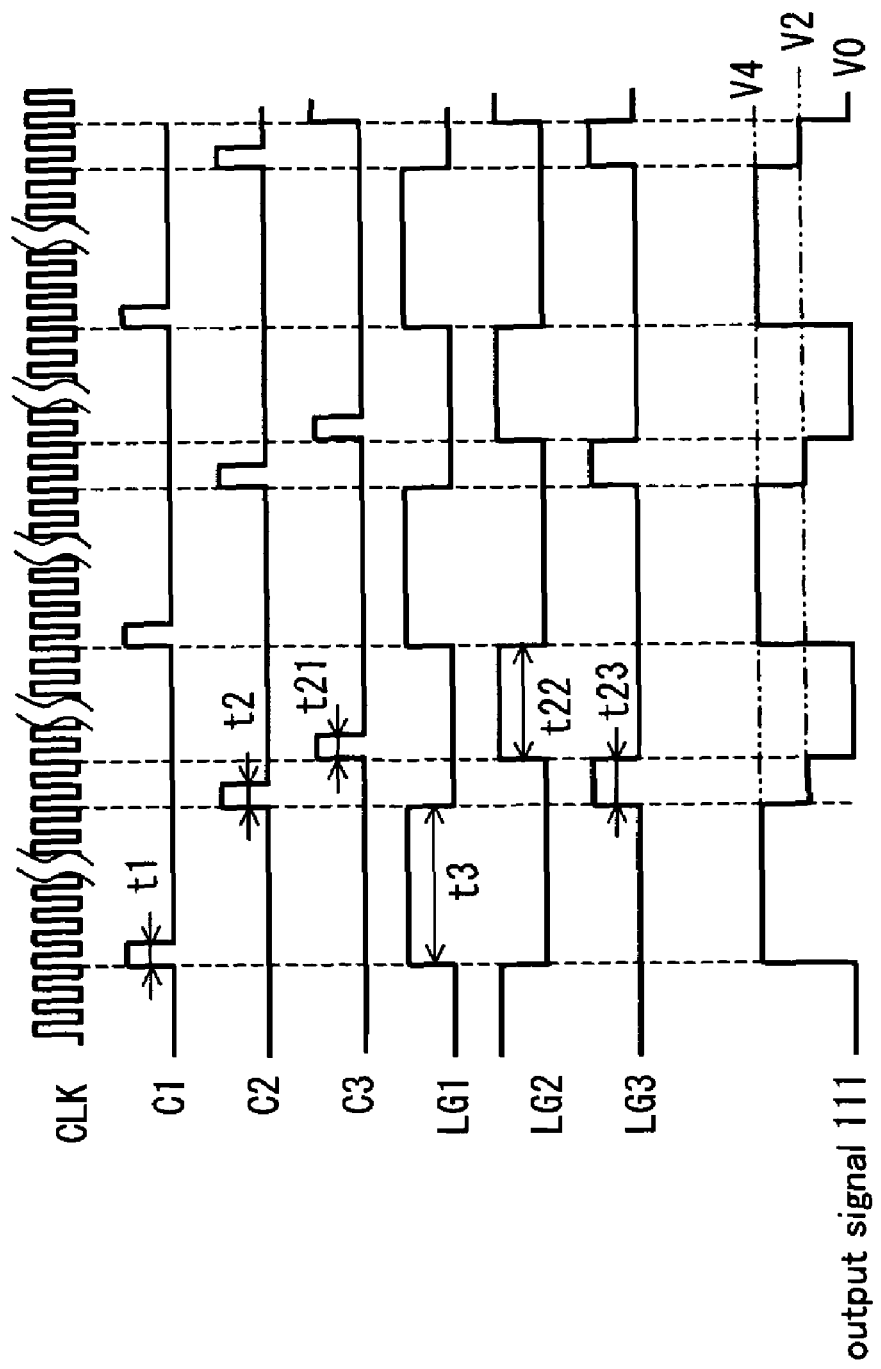
FIG. 7 is a chart showing operational waveforms in the second embodiment.

Next, the operation of the multi-rate PWM circuit 201 in FIG. 6 will be described by using FIG. 7. In FIG. 7, widths t1, t2, t3 are outputted in a similar manner as in FIG. 3. When the number of counts of reference clocks CLK inputted to the up counter 102 reaches the set value registered in the additional pulse width register 202, the signal C3 with a width t21 corresponding to one reference clock is outputted from the comparator 203 to the logic circuit 204.

The logic circuit 204 generates the signal LG3 with a width t23 that is an interval from a rising edge of the signal C2 with the width t2 to a rising edge of the signal C3 with the width t21. Further, the signal LG2 with a width t22 that is an interval from a rising edge of the signal C3 with the width t21 to a rising edge of the signal C1 with the width t1 is generated. A circuit generating the signals LG2 and LG3 is realized by the use of the SRFF 151 described in FIG. 4.

The operation of the present embodiment after the output of the signals LG1 to LG3 generated by the logic circuit 204 to the voltage controller 108 is the same as that of the first embodiment, that is, an output signal 111 is outputted from a selector 110 according to the logic shown in FIG. 2(b). Specifically, in FIG. 7, a cycle of the output signal 111 of PWM circuit is equal to a cycle of the signal C1, which corresponds to 10000 reference clocks. Further, a pulse width of a high-level period for operating a load is the width t3 and a voltage of the output signal 111 at this time is V4. An additional pulse added after the pulse width is the width t23 and the voltage of the output signal 111 at this time is V2. Likewise, a low-level period between the additional pulse and a next pulse width is the width t22, and the voltage of the output signal 111 at this time is V0. Thereafter, the high-level period, the additional pulse, and the low-level period are similarly repeated.

Incidentally, in FIG. 7, since the voltage V2 in the period of the additional pulse is ½ of the voltage V4 in the high-level period, this is equivalent to increasing the high-level period by a width corresponding to one clock in every cycle of the basic waveform, but in a case where the high-level period is desired to be increased by, for example, a 1/20000 width, the voltage V2 of the period of the additional pulse is set to ¼ of the voltage V4 of the high-level period.

Thus, in the output signal 111 of the multi-rate PWM circuit 201, the widths of the high-level period and the low-level period do not vary depending on each cycle, so that no jitter occurs in the waveform of the output signal 111. Moreover, since the width of the additional pulse corresponds to two clocks, variation in the output voltage in the transitional period from the high-level period to the low-level period can be made smoother.

Third Embodiment

Figure 8:
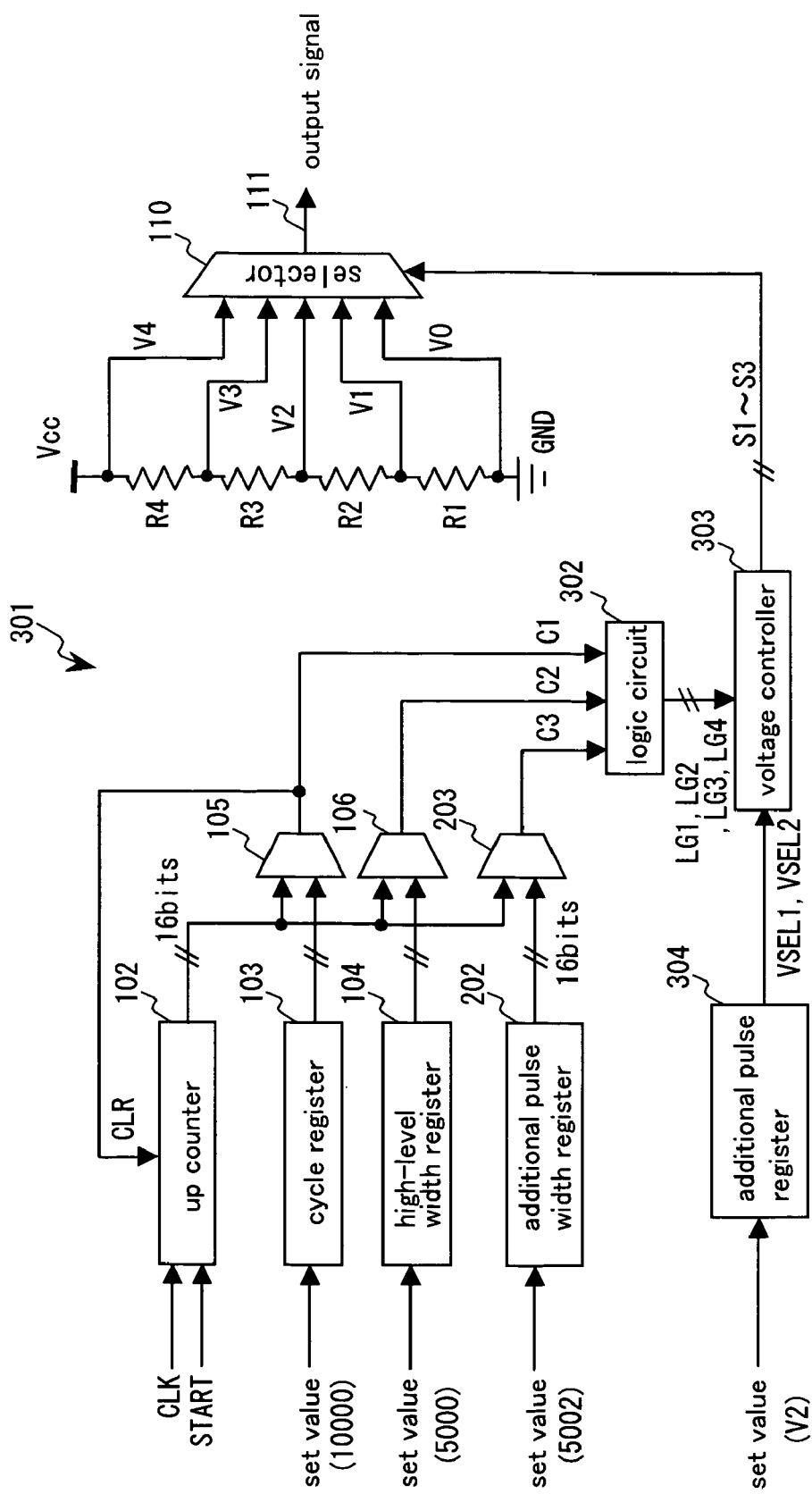
FIG. 8 is a block diagram showing a multi-rate PWM circuit 301 according to a third embodiment of the present invention.

Next, a PWM circuit by a multi-rate method according to a third embodiment of the present invention is shown in FIG. 8. The same reference symbols are used to designate the same elements as those in FIG. 1 and FIG. 6. A multi-rate PWM circuit 301 is different from the second embodiment in a logic circuit 302, a voltage controller 303, and an additional pulse register 304.

In the logic circuit 302, though the same signals C1 to C3 as those in the second embodiment are inputted thereto, signals generated thereby are four signals LG1, GL2, LG3, LG4. Further, the operation of outputting the signals LG1 and LG2 is the same as that in FIG. 7. As the signal LG3, the same signal as the signal C2 is outputted. The signal LG4 is generated to have a width from a falling edge of the signal C2 with a width t2 to a rising edge of the signal C3 with a width t21. A circuit generating the signal LG4 can be realized by using the SRFF 152 and the inverter 153 described in FIG. 4.

The additional pulse register 304 is a register setting a first output voltage (V3) and a second output voltage (V1) in periods of additional pulses, and set values are outputted as signals VSEL1 and VSEL2 to the voltage controller 303.

The voltage controller 303 operates according to the logic shown in FIG. 10.

Specifically, when logics of the signals LG1, LG2, LG3, LG4 are "1", "0", "0", "0" respectively, "0", "0", "1" are outputted as logics of selection signals S1, S2, S3 to a selector 110 so that an output voltage V4 is selected. Likewise, when the logics of the signals LG1, LG2, LG3, LG4 are "0", "1", "0", "0" respectively, "0", "0", "0" are outputted as the logics of the selection signals S1, S2, S3 to the selector 110 so that an output voltage V0 is selected. In particular, when the logics of the signals LG1, LG2, LG3, LG4 are "0", "0", "1", "0" respectively, "1", "1", "0" are outputted as the logics of the selection signals S1, S2, S3 to the selector 110 so that the voltage V3 designated by the signal VSEL1 outputted by the additional pulse register 304 is selected. Further, when the logics of the signals LG1, LG2, LG3, LG4 are "0", "0", "0", "1" respectively, "0", "0", "1" are outputted as the logics of the selection signals S1, S2, S3 to the selector 110 so that the voltage V1 designated by the signal VSEL2 outputted by the additional pulse register 304 is selected.

Figure 9:
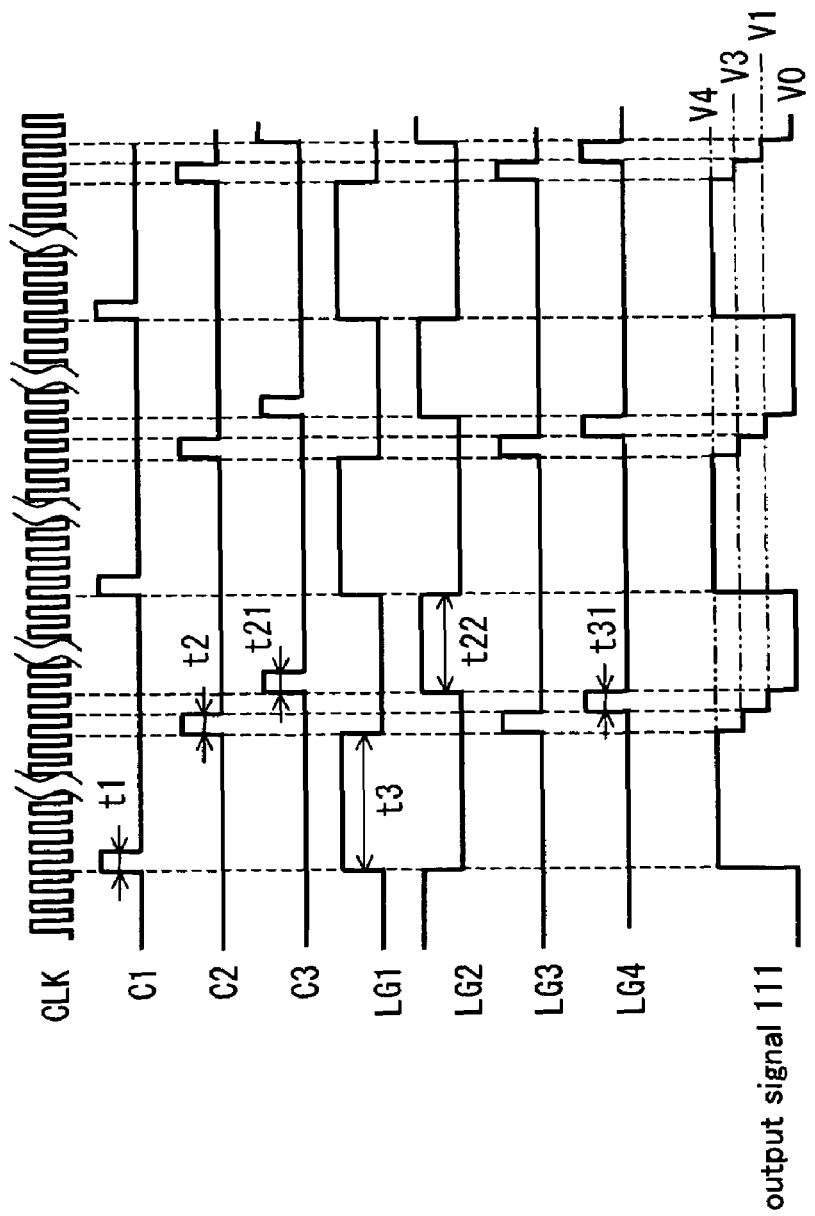
FIG. 9 is a chart showing operational waveforms in the third embodiment.

As a result, as shown in FIG. 9, a cycle of an output signal 111 of PWM is equal to a cycle of the signal C1, which corresponds to 10000 reference clocks CLK. Further, a pulse width of a high-level period for operating a load is a width t3, and a voltage of the output signal 111 at this time is V4. A first additional pulse added to the end of the pulse width has a width t2 and the voltage of the output signal 111 at this time is V3. A second additional pulse added to the end of the first additional pulse has a width t31 and the voltage of the output signal at this time is V1. Likewise, a low-level period subsequent to the second additional pulse is a width t22 and the voltage of the output signal 111 at this time is V0.

Thereafter, the high-level period, the first additional pulse, the second additional pulse, and the low-level period are similarly repeated.

Thus, in the output signal 111 of the multi-rate PWM circuit 301, the widths of the high-level period and the low-level period do not vary depending on each cycle, so that no jitter occurs in the waveform of the output signal 111. Moreover, in the transitional period from the high-level period to the low-level period, the first additional pulse whose voltage is slightly lower than the voltage of the high-level period and the second additional pulse whose voltage is lower than the voltage of the first additional pulse are added, which enables smoother variation of the output voltage.

Fourth Embodiment

Figure 11:
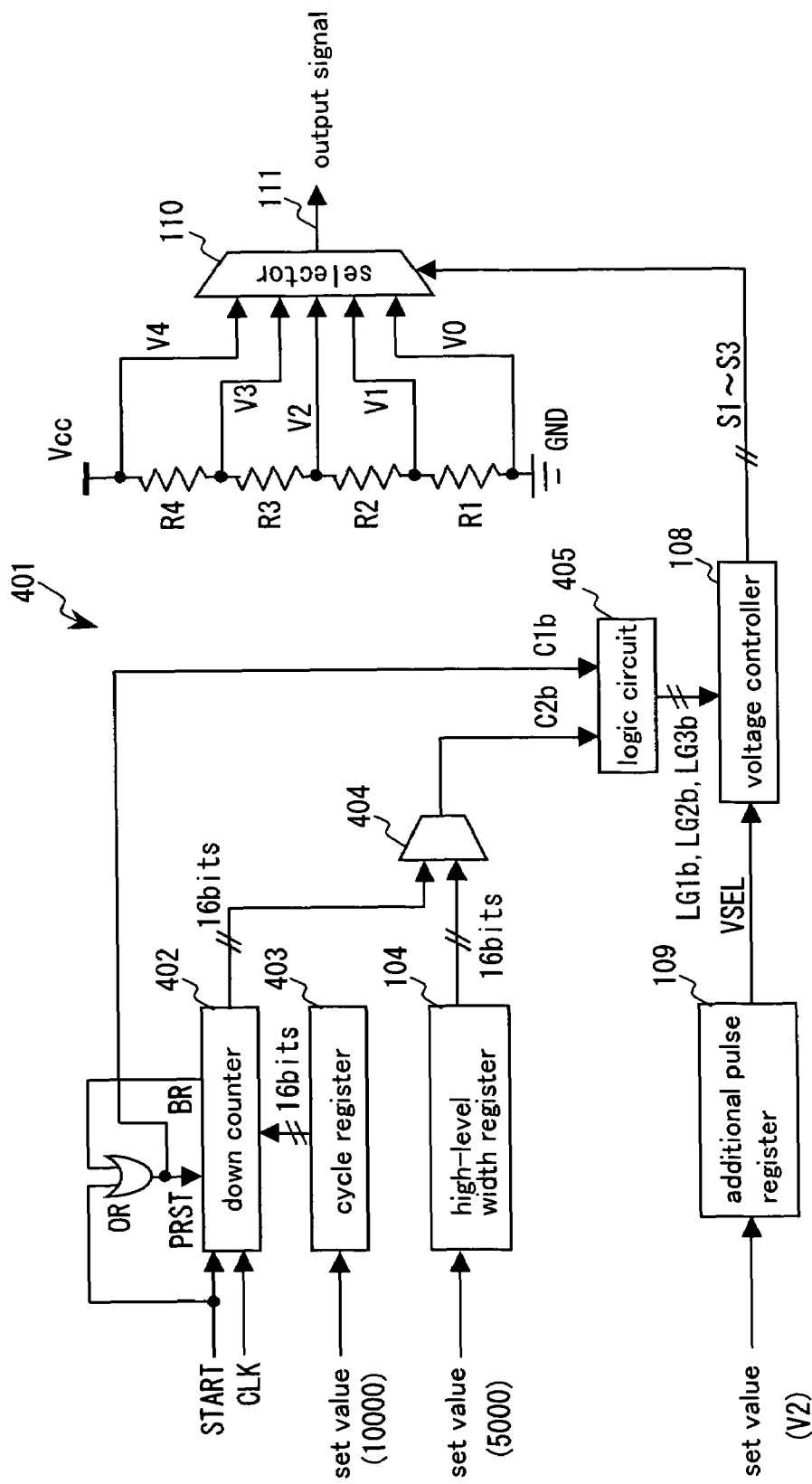
FIG. 11 is a block diagram of a multi-rate PWM circuit 401 according to a fourth embodiment of the present invention.

Next, a PWM circuit by a multi-rate method according to a fourth embodiment of the present invention is shown in FIG. 11. The same reference symbols are used to designate the same elements as those in FIG. 1. A multi-rate PWM circuit 401 is greatly different from the first embodiment in that a down counter 402 is used instead of the up counter. Moreover, a cycle value register 403, a comparator 404, and a logic circuit 405 are different.

The down counter 402 has inputs for a start signal START, reference clocks CLK, a preset PRST, and a borrow signal BR outputted when a counter further counts down from 0, and it further has a 16-bit preset value input. In addition, to the preset PRST, the start signal START and the borrow signal BR are inputted via a logical add OR. A value inputted to the 16-bit preset value input is set in the counter in synchronization with a rising edge of the preset PRST. Here, when the start signal STRT is inputted, a value 10000 registered in the cycle value register 403 is set in the down counter 402. Every time the reference clock CLK is inputted in this state, the down counter 402 decrements one by one.

A 16-bit count value outputted by the down counter 402 is outputted to the comparator 404. The comparator 404 compares the value 5000 set in a high-level width register 101 and the 16-bit count value outputted by the down counter 402, and if they match each other, the comparator 404 outputs a signal C2b to the logic circuit 405.

Figure 12:
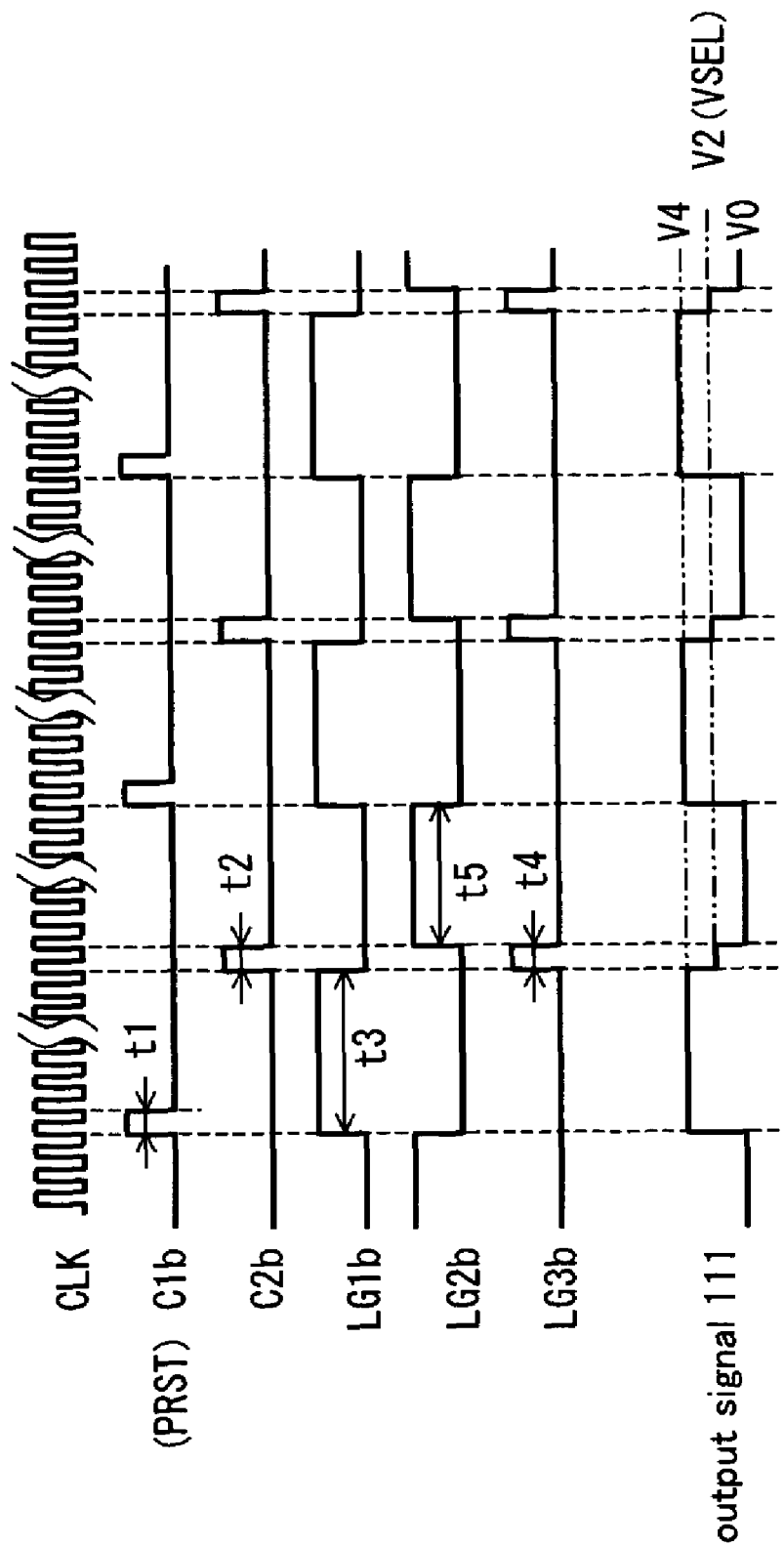
FIG. 12 is a chart showing operational waveforms in the fourth embodiment.

The signal C2b outputted by the comparator 404 and the preset PRST outputted as a signal C1b by the logical add OR are inputted to the logic circuit 405. As shown in FIG. 12, the operation of the logic circuit 405 is the same as the operation of the logic circuit 107 in the first embodiment shown in FIG. 3, though C1, C2, LG1, LG2, and LG3 in FIG. 3 are replaced by C1b, C2b, LG1b, LG2b, and LG3b respectively.

Specifically, a pulse width of a high-level period for operating a load is a width t3 and a voltage of an output signal 111 at this time is V4. An additional pulse added to the end of the pulse width is a width t4 and the voltage of the output signal 111 at this time is V2. Likewise, a low-level period between the additional pulse and a next pulse width is a width t5 and the voltage of the output signal 111 at this time is V0. Thereafter, the high-level period, the additional pulse, and the low-level period are similarly repeated.

Thus, in the output signal 111 of the multi-rate PWM circuit 401, the widths of the high-level period and the low-level period are constant, so that no jitter occurs in the waveform of the output signal 111. As a result, it is possible to reduce the influence of fluctuation ascribable to the jitter.

Fifth Embodiment

Figure 13:
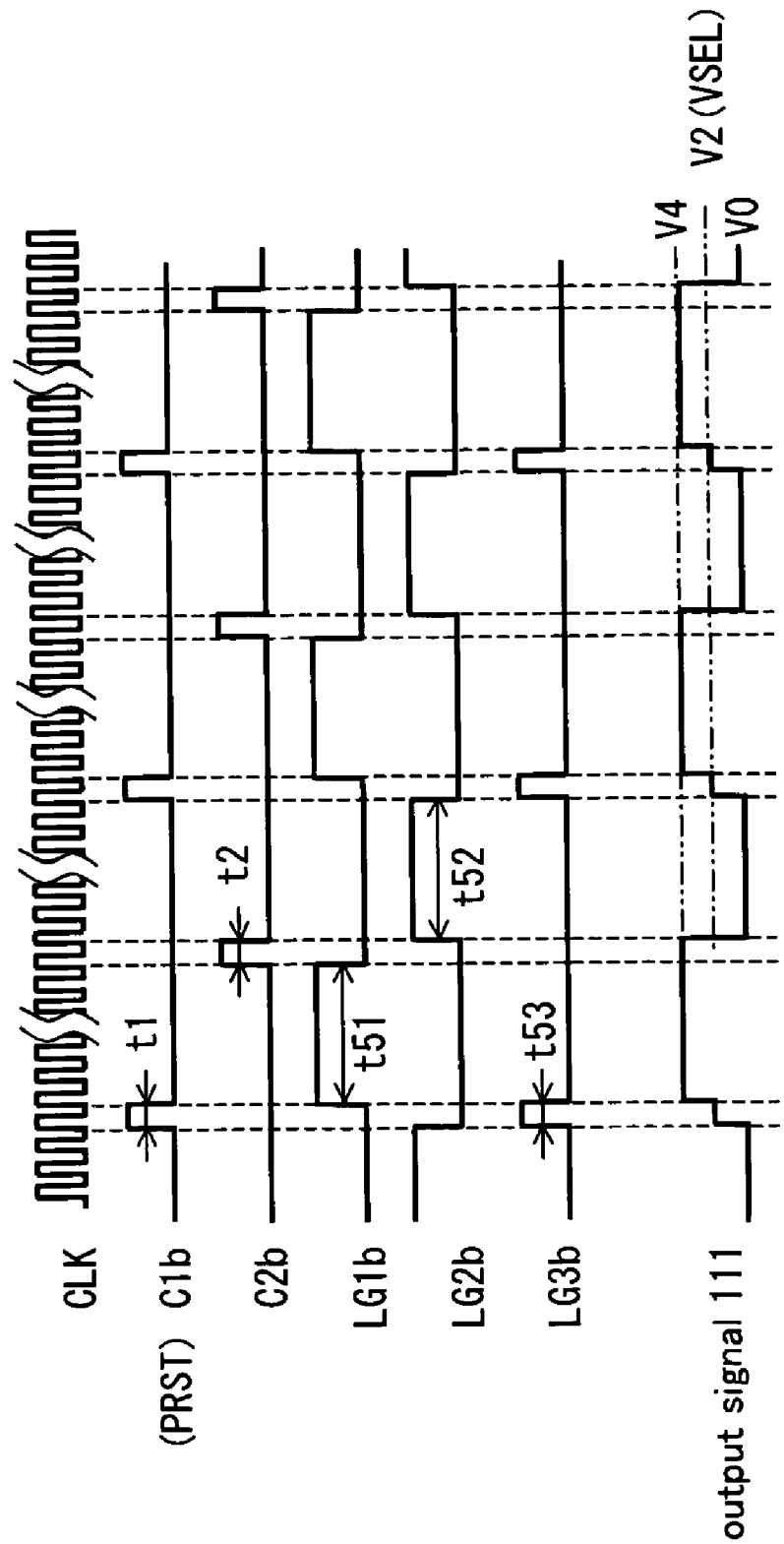
FIG. 13 is a chart showing operational waveforms in a fifth embodiment.

Next, a fifth embodiment will be described by using FIG. 13, in which only the operation of the logic circuit 405 of the fourth embodiment is changed.

As for the logic circuit 405 in the fifth embodiment, the same signals C1b and C2b as those in the fourth embodiment are inputted thereto, but signals LG1b to LG3b outputted therefrom to a voltage controller 303 are different. In FIG. 13, the signal LG1b is generated to have a width from a falling edge of the signal C1b with a width t1 to a rising edge of the signal C2b with a width t2. The signal LG2b is generated to have a width from a falling edge of the signal C2b with the width t2 to a rising edge of the signal C1b with the width t1. As the signal LG3b, the same signal as the signal C1b is outputted. A circuit generating these signals LGb1 to LGb3 can be realized based on the same principle as that of a circuit using the SRFF 151, SRFF 152, and the inverter 153 described in FIG. 4.

As a result, in an output signal 111 of PWM of the multi-rate PWM circuit 401, a pulse width of a high-level period for operating a load is a width t51 and a voltage of the output voltage 111 at this time is V4. An additional pulse added to the beginning of the pulse width is a width t53 and the voltage of the output signal 111 at this time is V2. Likewise, a low-level period is a width t52 and the voltage of the output signal 111 at this time is V0. Thereafter, the additional pulse, the high-level period, and the low-level period are similarly repeated.

Thus, in the output signal 111 of the multi-rate PWM circuit 401, the widths of the high-level period and the low-level period are constant, so that no jitter occurs in the waveform of the output signal 111. As a result, it is possible to reduce the influence of fluctuation ascribable to the jitter.

Sixth Embodiment

Figure 14:
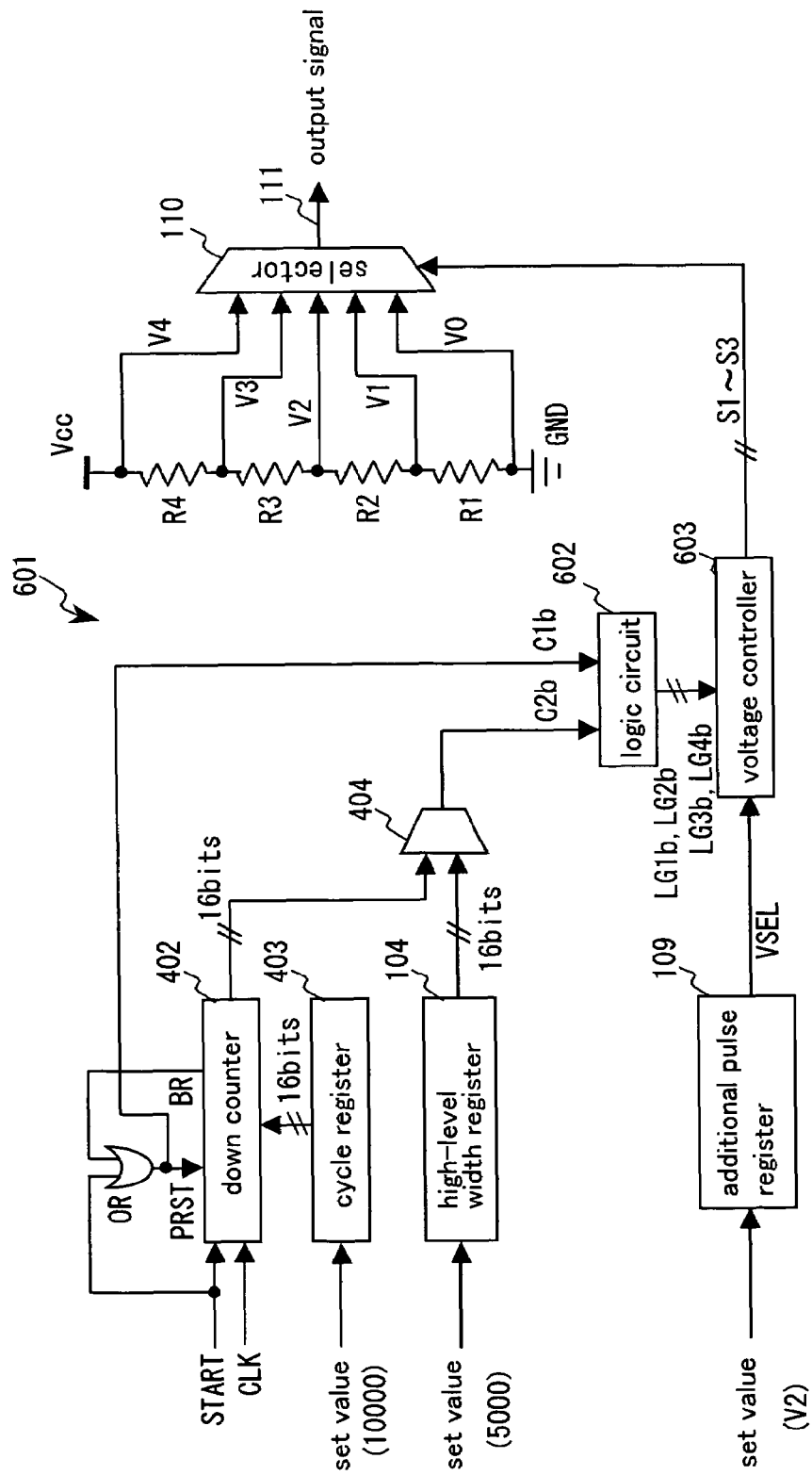
FIG. 14 is a block diagram of a multi-rate PWM circuit 601 according to a sixth embodiment of the present invention.

Next, a PWM circuit by a multi-rate method according to a sixth embodiment of the present invention is shown in FIG. 14. The same reference symbols are used to designate the same elements as those in FIG. 11. A multi-rate PWM circuit 601 is greatly different from the fourth and fifth embodiments in a logic circuit 602 and a voltage controller 603.

Figure 15:
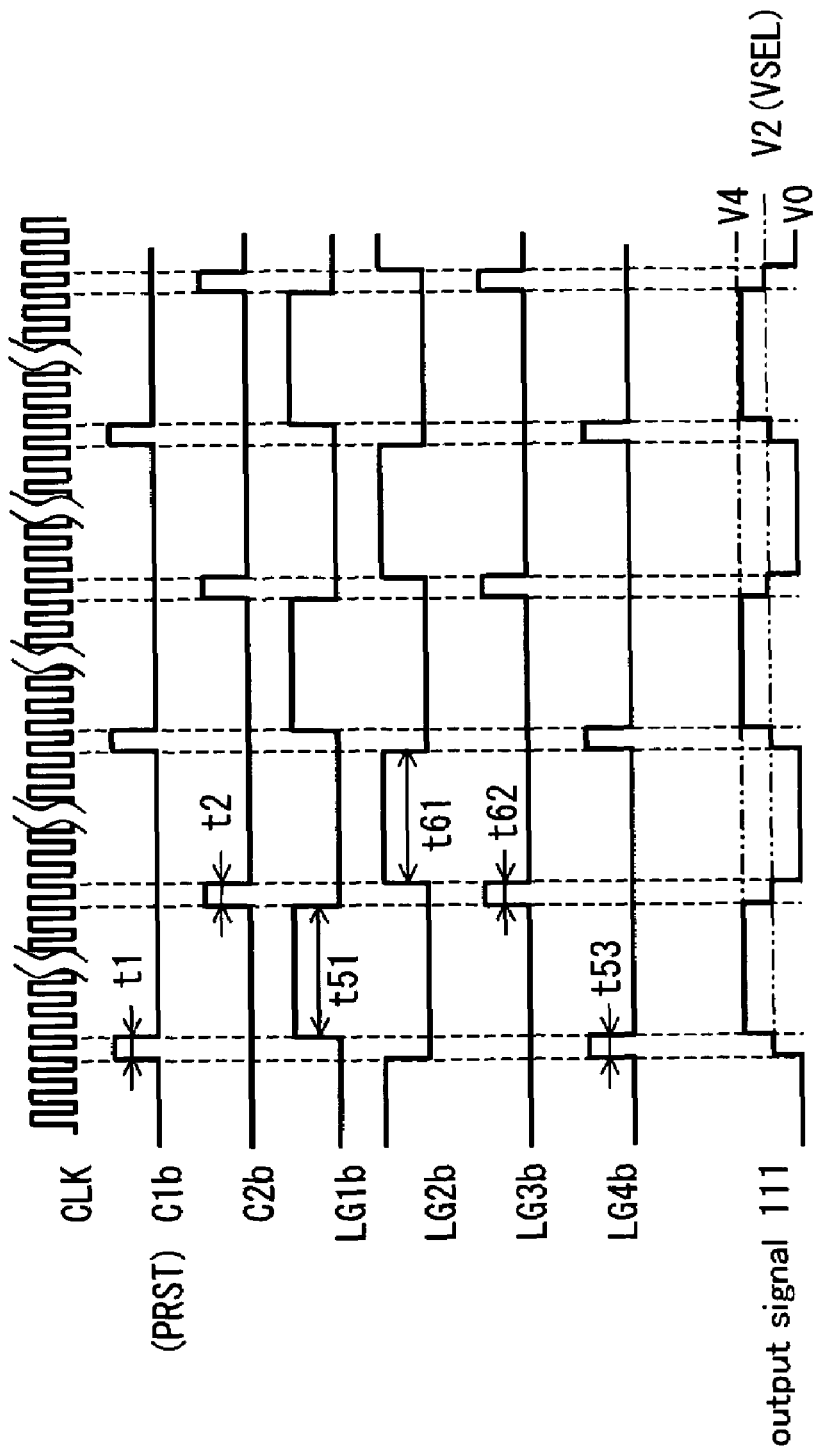
FIG. 15 is a chart showing operational waveforms in the sixth embodiment.

Although the same signals C1b and C2b as those in the fourth and fifth embodiments are inputted to the logic circuit 602, signals outputted therefrom to the voltage controller 603 are different and they are four signals LG1b to LG4b. In FIG. 15, the signals LG1b and LG4b are the same as those in FIG. 13 of the fifth embodiment. The signal LG2b is generated to have a width from a falling edge of the signal C2b with a width t2 to a rising edge of the signal C1b with a width t1. As the signal LG3b, the same signal as the signal C2b is outputted.

The voltage controller 603 operates under the same logic as that of the voltage controller 108 in FIG. 2(b) of the first embodiment, though the signal LG1 is replaced by LG1b, the signal LG2 is replaced by LG2b, and the signal LG3 is replaced by LG3b and LG4b. That is, a voltage V4 is outputted in a period of the signal LG1b and a voltage V0 is outputted in a period of the signal LG2b. Further, a voltage V2 is outputted in periods of the signals LGb3 and LG4b.

As a result, in FIG. 15, in an output signal 111 of PWM of the multi-rate PWM circuit 601, a pulse width of a high-level period for operating a load is a width t51 and a voltage of the output signal 111 at this time is V4. An additional pulse added to the beginning of the pulse width is a width t53 and the voltage of the output signal 111 at this time is V2. An additional pulse added after the pulse width is a width t62 and the voltage of the output signal 111 at this time is V2. Likewise, a low-level period is a width t61 and the voltage of the output signal 111 at this time is V0. Thereafter, the former additional pulse, the high-level period, the latter additional pulse, and the low-level period are similarly repeated.

Thus, in the output signal 111 of the multi-rate PWM circuit 601, the widths of the high-level period and the low-level period are constant, so that no jitter occurs in the waveform of the output signal 111. Moreover, in a transitional period from the high-level period to the low-level period and in a transitional period from the low-level period to the high-level period, the additional pulse at the voltage equal to ½ of the voltage of the high-level period is added, which enables smooth variation of the output voltage.

The invention is not limited to the above embodiments and various modifications may be made without departing from the spirit and scope of the invention. Any improvement may be made in part or all of the components.

What is claimed is:

1. A PWM circuit comprising:
   a counter counting reference clocks;
   a cycle register in which a set value indicating a cycle is registered;
   a cycle detector comparing an output value of said counter and the set value registered in said cycle register indicating a cycle;
   a pulse width register in which a set value indicating a pulse width is registered;
   a pulse width detector comparing the output value of said counter and the set value registered in said pulse width register indicating a pulse width;
   a voltage generator generating a plurality of voltages;
   a selector selecting a voltage from the plural voltages generated by said voltage generator and outputting the voltage;
   an additional pulse register in which a first voltage of a first additional pulse is registered, the first additional pulse being to be added to said pulse width; and
   a voltage controller that controls the voltage outputted by said selector and a period in which the voltage is output, according to a cycle detection signal outputted by said cycle detector, a pulse width detection signal outputted by said pulse width detector, and the first voltage outputted by said additional pulse register, wherein
   said voltage controller controls said selector so as to add the first additional pulse to an end of said pulse width.

2. The PWM circuit according to claim 1, further comprising
   an additional pulse detector detecting the output value of said counter and a width of the first additional pulse, wherein
   said voltage controller controls the voltage outputted by said selector and the period in which the voltage is output, according to the cycle detection signal outputted by said cycle detector, the pulse width detection signal outputted by said pulse width detector, an additional pulse detection signal outputted by said additional pulse detector, and a set value indicating the first voltage outputted by said additional pulse register.

3. The PWM circuit according to claim 1, wherein
   said voltage generator is constituted of a voltage divide resistance circuit.

4. The PWM circuit according to claim 1, wherein
   said counter is constituted of an up counter.

5. The PWM circuit according to claim 1, wherein
   said counter is constituted of a down counter.

6. The PWM circuit according to claim 1, wherein:
   said additional pulse register sets the first voltage of the first additional pulse and a second voltage of a second additional pulse; and
   said voltage controller controls said selector so as to add the first additional pulse and the second additional pulse in sequence to the end of said pulse width.

7. The PWM circuit according to claim 1, wherein
   said voltage controller controls said selector so as to add the first additional pulse to a beginning of said pulse width.

8. The PWM circuit according to claim 1, wherein
   said voltage controller controls said selector so as to add the first additional pulse to the beginning and end of said pulse width.

* * * * *